United States Patent
Tanobe

(10) Patent No.: US 12,489,069 B2
(45) Date of Patent: Dec. 2, 2025

(54) HIGH FREQUENCY PACKAGE

(71) Applicant: NTT, Inc., Tokyo (JP)

(72) Inventor: Hiromasa Tanobe, Tokyo (JP)

(73) Assignee: NTT, Inc., Tokyo (JP)

( * ) Notice: Subject to any disclaimer, the term of this patent is extended or adjusted under 35 U.S.C. 154(b) by 889 days.

(21) Appl. No.: 17/765,103

(22) PCT Filed: Jul. 20, 2020

(86) PCT No.: PCT/JP2020/028088
§ 371 (c)(1),
(2) Date: Mar. 30, 2022

(87) PCT Pub. No.: WO2022/018793
PCT Pub. Date: Jan. 27, 2022

(65) Prior Publication Data
US 2022/0344289 A1 Oct. 27, 2022

(51) Int. Cl.
*H01L 23/00* (2006.01)
*H01L 21/48* (2006.01)
*H01L 23/498* (2006.01)
*H01L 23/66* (2006.01)
*H01P 3/02* (2006.01)

(52) U.S. Cl.
CPC .......... *H01L 23/66* (2013.01); *H01L 21/4853* (2013.01); *H01L 23/49838* (2013.01); *H01P 3/026* (2013.01); *H01L 23/49811* (2013.01); *H01L 2223/6627* (2013.01); *H01L 2223/6638* (2013.01); *H01L 2223/6694* (2013.01)

(58) Field of Classification Search
CPC ......... H01L 23/49838; H01L 23/49861; H01L 23/49811; H01L 23/49555
See application file for complete search history.

(56) References Cited

U.S. PATENT DOCUMENTS

| 5,196,725 A | 3/1993 | Mita et al. |
| 2002/0167017 A1 | 11/2002 | Nakabayashi et al. |
| 2005/0054142 A1 | 3/2005 | Ino et al. |
| 2012/0051000 A1 | 3/2012 | Laidig et al. |

(Continued)

FOREIGN PATENT DOCUMENTS

| JP | 54150464 U | 10/1979 |
| JP | 2002270942 A | 9/2002 |

(Continued)

OTHER PUBLICATIONS

OIF Optical Internetworking Forum, "Implementation Agreement for Integrated Dual Polarization Intradyne Coherent Receivers", IA # OIF-DPC-RX-01.2, Nov. 14, 2013, 25 pages.

(Continued)

*Primary Examiner* — Reema Patel
(74) *Attorney, Agent, or Firm* — Slater Matsil, LLP

(57) ABSTRACT

A first signal lead pin is bent such that one end is connected to a first signal line of a differential coplanar line, and the other end is apart from a mounting surface. A second signal lead pin is bent such that one end is connected to a second signal line of the differential coplanar line, and the other end is apart from the mounting surface. A ground lead pin is bent such that one end is connected to a ground line of the differential coplanar line, and the other end is apart from the mounting surface.

16 Claims, 7 Drawing Sheets

(56) References Cited

U.S. PATENT DOCUMENTS

2017/0323836 A1    11/2017   Kawazu
2019/0148316 A1     5/2019   Kubo et al.

FOREIGN PATENT DOCUMENTS

| JP | 2005086014 A | | 3/2005 | |
|---|---|---|---|---|
| JP | 2011134789 | * | 7/2011 | ............ H01L 23/12 |
| JP | 2011134789 A | | 7/2011 | |
| JP | 4934733 B | | 5/2012 | |
| KR | 20080086042 | * | 9/2008 | ............ H01L 21/60 |
| WO | 2014192687 A1 | | 12/2014 | |
| WO | 2018003332 A1 | | 4/2018 | |

OTHER PUBLICATIONS

Chang Fei Yee, "Key high-speed connector layout techniques", [searched Jul. 10, 2020], (https://www.edn.com/key-high-speed-connector-layout-techniques/), Sep. 8, 2016, 6 pages.

* cited by examiner

HIGH FREQUENCY PACKAGE

CROSS-REFERENCE TO RELATED APPLICATIONS

This application is a national phase entry of PCT Application No. PCT/JP2020/028088, filed on Jul. 20, 2020, which application is hereby incorporated herein by reference.

TECHNICAL FIELD

The present invention relates to a high frequency package including a differential coplanar line.

BACKGROUND

In a device configured to process a high-speed differential signal, including digital coherent optical transmission, a high frequency signal device package including a differential coplanar line in which two ground lines are arranged across two signal lines adjacent to each other is used. In the differential coplanar line, it is important to make an appropriate high frequency design for impedance matching and the like between the ground line and the signal line or between the two adjacent signal lines from a printed board to a semiconductor chip. In this high frequency design, a distance between wirings, a distance between lead pins connected to the wirings and used for mounting, and the shapes of the lead pins are very important parameters.

RELATED ART LITERATURE

Patent Literature

Patent Literature 1: Japanese Patent No. 4934733

Non-Patent Literature

Non-Patent Literature 1: Implementation Agreement for Integrated Dual Polarization Intradyne Coherent Receivers, IA #OIF-DPC-RX-01.2, Nov. 14, 2013.
Non-Patent Literature 2: Chang Fei Yee, "Key high-speed connector layout techniques", [searched Jul. 10, 2020], (https://www.edn.com/key-high-speed-connector-layout-techniques/).

SUMMARY

Problem to be Solved by Embodiments of the Invention

However, standardization bodies such as "Optical Internetworking Forum" have decided the sizes and positions of lead pins to be solder-mounted, which should be satisfied by a high frequency signal device package holding a semiconductor chip and mounted on a printed board. It is therefore impossible to freely decide the distances and shapes of lead pins. As described in non-patent literature 1, the shapes of high frequency lead pins are defined (see FIG. 9), and a change of pitches between signal (+)/(−) leads necessary for improving the high frequency characteristic is not permitted. As described above, since the degree of freedom of the high frequency design in high-speed signal transmission is low, it is impossible to appropriately set electromagnetic coupling serving as a differential transmission path between two signal lines.

For example, non-patent literature 1 shows an optical reception module 400 which includes a DC terminal 403 and an output terminal 404 and on which an optical circuit 401 configured to perform optical signal processing for optical signals input from two input ports 402a and 402b is mounted, as shown in FIG. 10. In this technique, details of the structure of a high frequency lead pin that affects the high frequency characteristic in the optical reception module including a plurality of high frequency lead pins are not disclosed. Also, in non-patent literature 2, the three-dimensional shape of lead pins is shown (see FIG. 11). It is assumed that all the pitch intervals between metal pads on a printed board and a distance between the lead pins are equal from the contact surface. Since the impedance becomes high in portions exposed to air, two signal lead pins are preferably brought as close as possible even from halfway. However, such a structure is not shown in detail and is not mentioned at all.

Embodiments of the present invention have been made to solve the above-described problems, and has as its object to appropriately set electromagnetic coupling serving as a differential transmission path between two signal lines in a high frequency package including a differential coplanar line.

Means of Solution to the Problem

According to embodiments of the present invention, there is provided a high frequency package comprising a package main body including a substrate made of an insulator, a differential coplanar line formed on the substrate, and formed by a first ground line, a first signal line, a second signal line, and a second ground line, a first ground lead pin arranged on a side of a mounting surface of the package main body and bent such that one end is connected to the first ground line, and the other end is apart from the mounting surface, a first signal lead pin arranged on the side of the mounting surface of the package main body, bent such that one end is connected to the first signal line, and the other end is apart from the mounting surface, and extending in the same direction as the first ground lead pin, a second signal lead pin arranged on the side of the mounting surface of the package main body, bent such that one end is connected to the second signal line, and the other end is apart from the mounting surface, and extending in the same direction as the first ground lead pin, and a second ground lead pin arranged on the side of the mounting surface of the package main body, bent such that one end is connected to the second ground line, and the other end is apart from the mounting surface, and extending in the same direction as the first ground lead pin, wherein a distance between the other end side of the first signal lead pin and the other end side of the second signal lead pin is different from a distance between the one end side of the first signal lead pin and the one end side of the second signal lead pin.

Effect of Embodiments of the Invention

As described above, according to embodiments of the present invention, it is possible to appropriately set electromagnetic coupling serving as a differential transmission path between two signal lines because each lead pin is bent such that each lead pin, whose one end is arranged on the mounting surface of the package main body, has the other end apart from the mounting surface.

DETAILED DESCRIPTION OF ILLUSTRATIVE EMBODIMENTS

A high frequency package according to an embodiment of the present invention will be described below.

First Embodiment

Figure 1A:
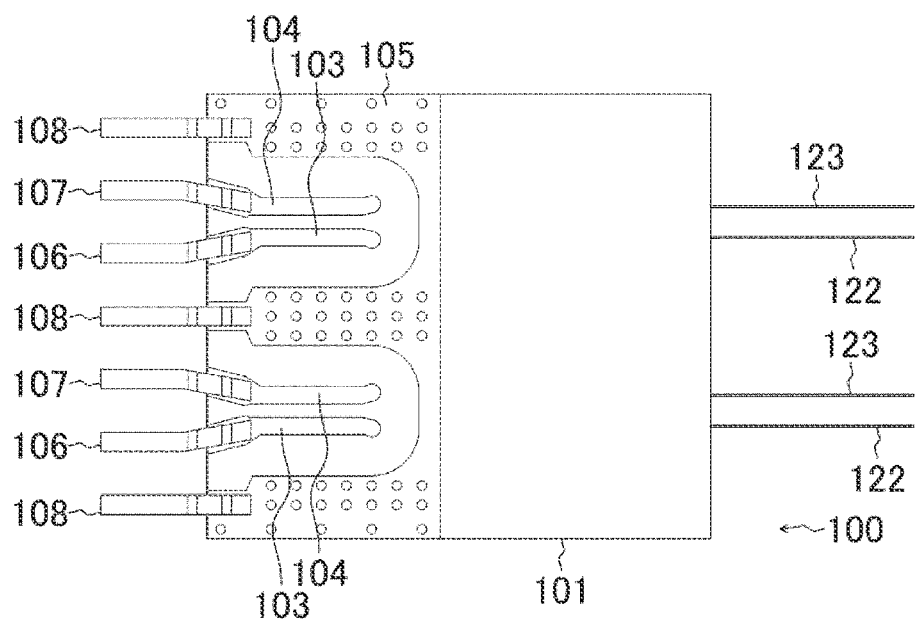
FIG. 1A is a plan view showing the configuration of a high frequency package according to the first embodiment of the present invention.
Figure 1B:
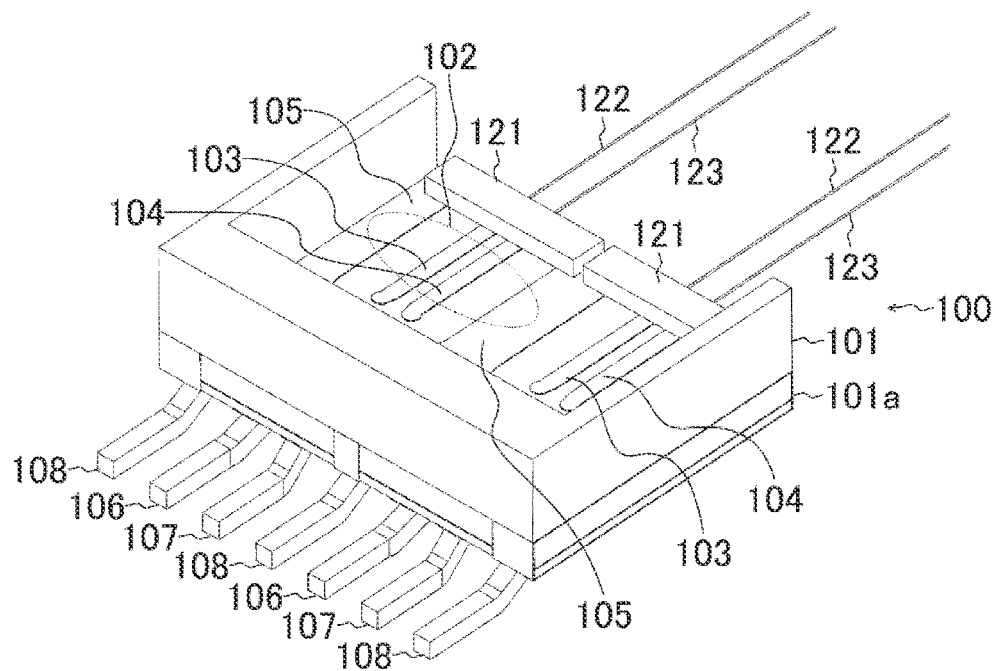
FIG. 1B is a perspective view showing the configuration of a part of the high frequency package according to the first embodiment of the present invention.
Figure 1C:
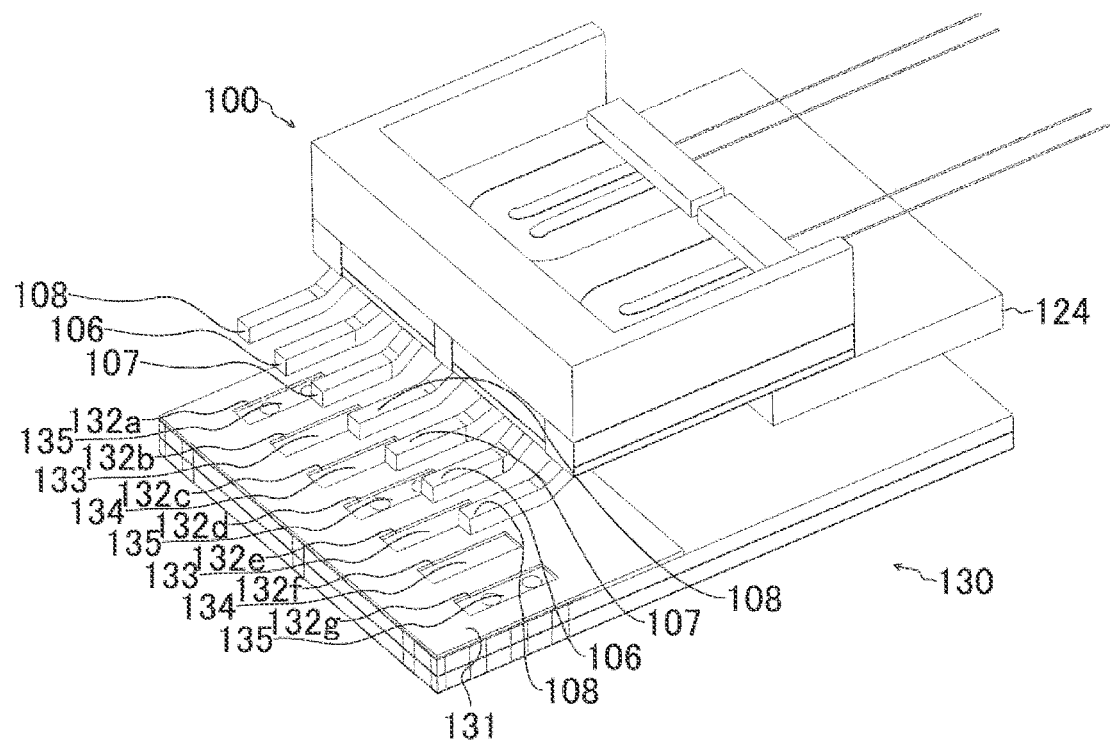
FIG. 1C is a perspective view showing the configuration of a part of the high frequency package according to the first embodiment of the present invention.

A high frequency package 100 according to the first embodiment of the present invention will be described first with reference to FIGS. 1A, 1B, and 1C. The high frequency package 100 includes a package main body 101 and differential coplanar lines 102. Note that FIG. 1A shows the mounting surface of the package main body 101.

The package main body 101 includes a substrate 101a made of an insulator (dielectric), and the differential coplanar lines 102 are formed on the substrate 101a. For example, on the substrate 101a, a photoelectric conversion chip 121 is connected to the input and output terminals of each differential coplanar line 102. Conversion between an optical signal and a high frequency electrical signal is performed between an optical fiber 122 and an optical fiber 123 connected to the photoelectric conversion chip 121. The photoelectric conversion chip 121 has, for example, a differential amplification type (balance type) photoelectric conversion function by two photodiodes.

The differential coplanar line 102 includes a first signal line 103, a second signal line 104, and a plurality of ground lines (ground planes) 105 arranged across these signal lines. The ground lines 105 are arranged along the first signal line 103 and the second signal line 104. The first signal line 103, the second signal line 104, and the ground lines 105 are formed by, for example, metal wirings formed on the package main body 101 (substrate 101a).

The high frequency package 100 also includes first signal lead pins 106, second signal lead pins 107, and ground lead pins 108.

The first signal lead pins 106 are arranged on the side of the mounting surface of the package main body 101. In addition, each first signal lead pin 106 is bent such that one end is connected to the first signal line 103 of the differential coplanar line 102, and the other end is apart from the mounting surface.

The second signal lead pins 107 are arranged on the side of the mounting surface of the package main body 101. In addition, each second signal lead pin 107 is bent such that one end is connected to the second signal line 104 of the differential coplanar line 102, and the other end is apart from the mounting surface. Also, the second signal lead pins 107 extend in the same direction as the first signal lead pins 106. Note that a spacer made of ceramic can be arranged between the side of one end of the first signal lead pin 106 and the side of one end of the second signal lead pin 107.

The ground lead pins 108 are arranged on the side of the mounting surface of the package main body 101. In addition, each ground lead pin 108 is bent such that one end is connected to the ground line 105 of the differential coplanar line 102, and the other end is apart from the mounting surface. Also, the ground lead pins 108 extend in the same direction as the first signal lead pins 106.

In the first embodiment, an example in which two differential coplanar lines 102 are provided is shown, and the ground lines 105 are shared by these. Also, an example in which the ground lead pin 108 arranged between the adjacent differential coplanar lines 102 is commonly used by these is shown. Note that plural, or three or more differential coplanar lines 102 may be provided in one high frequency package 100.

In addition to the above-described configuration, in the high frequency package 100, the distance between the other end side of the first signal lead pin 106 and the other end side of the second signal lead pin 107 is different from the distance between the one end side of the first signal lead pin 106 and the one end side of the second signal lead pin 107. For example, the distance between the other end side of the first signal lead pin 106 and the other end side of the second signal lead pin 107 is larger than the distance between the one end side of the first signal lead pin 106 and the one end side of the second signal lead pin 107. Note that in the first embodiment, the distal ends of the ground lead pins 108 on the other end side, the distal ends of the first signal lead pins 106 on the other end side, and the distal ends of the second signal lead pins 107 on the other end side are arranged on the same line.

The high frequency package 100 is mounted on a mounting board 130. As is well known, the mounting board 130 has a multilayer wiring structure including a surface metal layer, a two-layered metal layer, a three-layered metal layer, and the like, and dielectric layers are arranged between the metal layers. In addition, the metal layers are connected by a through wiring extending through the dielectric layers, or the like. Also, in a partial region, a spacer 124 is arranged to make the distance constant between a part of the high frequency package 100 and the mounting board 130.

On the surface of the mounting board 130, for example, in a resin layer 131 made of a heat-resistant resin, a plurality of openings 132*a*, 132*b*, 132*c*, 132*d*, 132*e*, 132*f*, and 132*g* are formed. Ground terminals 135 are defined by the openings 132*a*, 132*d*, and 132*g*. Also, first signal terminals 133 are defined by the openings 132*b* and 132*e*. In addition, second signal terminals 134 are defined by the openings 132*c* and 132*f*.

When mounting the high frequency package 100 on the mounting board 130, the ground lead pins 108 are connected to the ground terminals 135. Also, the first signal lines 103 are connected to the first signal terminals 133. In addition, the second signal lines 104 are connected to the second signal terminals 134.

According to the first embodiment, the distance between the first signal lead pin 106 and the second signal lead pin 107 on the mounting surface of the package main body 101 is different from the distance between the first signal lead pin 106 and the second signal lead pin 107 on the mounting board 130.

In other words, each lead pin is bent such that each lead pin, whose one end is arranged on the mounting surface of the package main body 101, has the other end apart from the mounting surface. For this reason, the distance between the first signal lead pin 106 and the second signal lead pin 107 on the mounting surface and the distance between the first signal lead pin 106 and the second signal lead pin 107 on the mounting board 130 can be made different from each other.

As a result, according to the first embodiment, even if the distance between the first signal lead pin 106 and the second signal lead pin 107 on the mounting surface is fixed, the distance between the first signal lead pin 106 and the second signal lead pin 107 can freely be designed in the package main body 101. For example, when the distance between the other end side of the first signal lead pin 106 and the other end side of the second signal lead pin 107 is made larger than the distance between the one end side of the first signal lead pin 106 and the one end side of the second signal lead pin 107, electromagnetic coupling (by improvement of the electrostatic capacitance) between the signal lines can be made stronger on the side of the package main body 101, and it is possible to optimize the differential characteristic impedance and reduce crosstalk to an adjacent differential channel.

As described above, according to the first embodiment, it is possible to appropriately set electromagnetic coupling serving as a differential transmission path between two signal lines.

Second Embodiment

Figure 2:
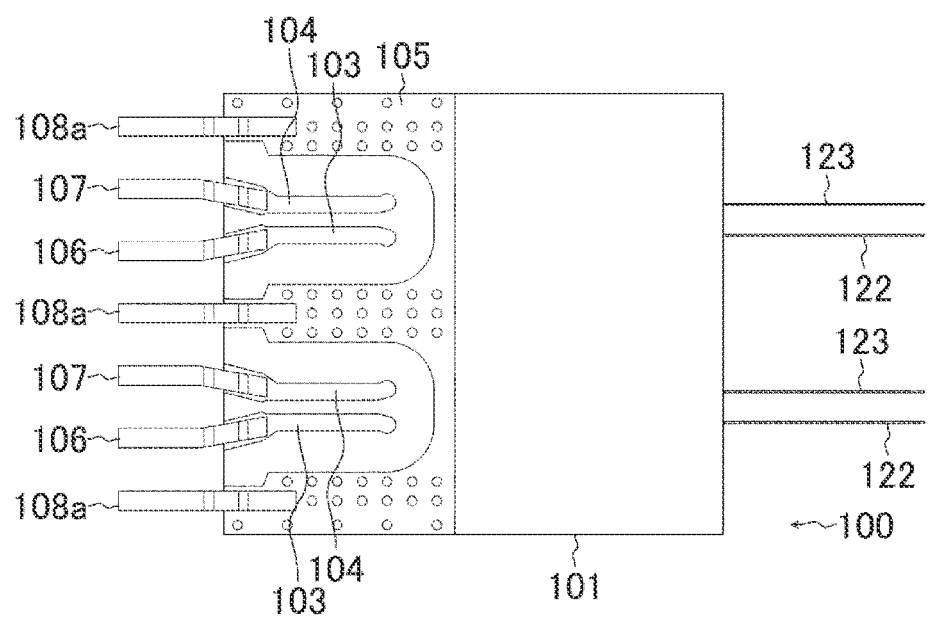
FIG. 2 is a plan view showing the configuration of a high frequency package according to the second embodiment of the present invention.

The second embodiment of the present invention will be described next with reference to FIG. 2. FIG. 2 shows the mounting surface of a package main body 101. A high frequency package 100 includes the package main body 101 and differential coplanar lines 102. The package main body 101 includes a substrate 101*a*, and the differential coplanar lines 102 are formed on the substrate 101*a*. The differential coplanar line 102 includes a first signal line 103, a second signal line 104, and a plurality of ground lines 105. The high frequency package 100 also includes first signal lead pins 106 and second signal lead pins 107. These components are the same as in the above-described first embodiment.

In the second embodiment, ground lead pins 108*a* are longer than the first signal lead pins 106 and the second signal lead pins 107. Note that in the second embodiment, the distal ends of the ground lead pins 108*a* on the other end side, the distal ends of the first signal lead pins 106 on the other end side, and the distal ends of the second signal lead pins 107 on the other end side are arranged on the same line.

Hence, the ground lead pins 108*a* are extended on one end side on the side of the high frequency package 100 as compared to the first signal lead pins 106 and the second signal lead pins 107.

Third Embodiment

Figure 3:
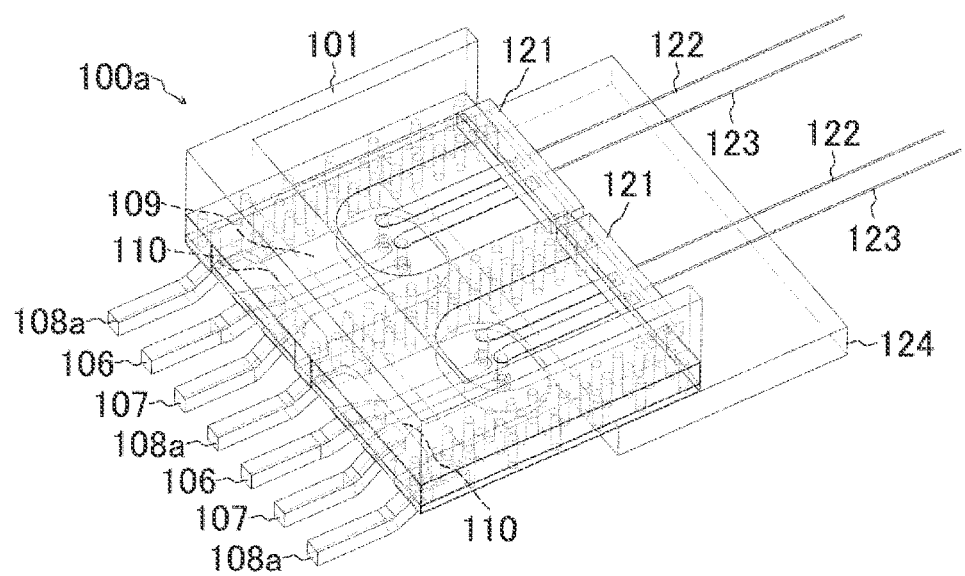
FIG. 3 is a perspective view showing the configuration of a high frequency package according to the third embodiment of the present invention.

A high frequency package 100*a* according to the third embodiment of the present invention will be described next with reference to FIG. 3. The high frequency package 100*a* includes a package main body 101 and differential coplanar lines 102. The package main body 101 includes a substrate 101*a*, and the differential coplanar lines 102 are formed on the substrate 101*a*. The differential coplanar line 102 includes a first signal line 103, a second signal line 104, and a plurality of ground lines 105. The high frequency package 100*a* also includes first signal lead pins 106, second signal lead pins 107, and ground lead pins 108*a*. These components are the same as in the above-described second embodiment.

In the third embodiment, the package main body 101 (substrate 101*a*) includes a metal layer 109 to which the ground lines 105 are connected. In addition, the metal layer 109 includes notches 110 in a first connecting portion between one end of the first signal lead pin 106 and the first signal line 103 and a second connecting portion between one end of the second signal lead pin 107 and the second signal line 104.

Fourth Embodiment

Figure 4:
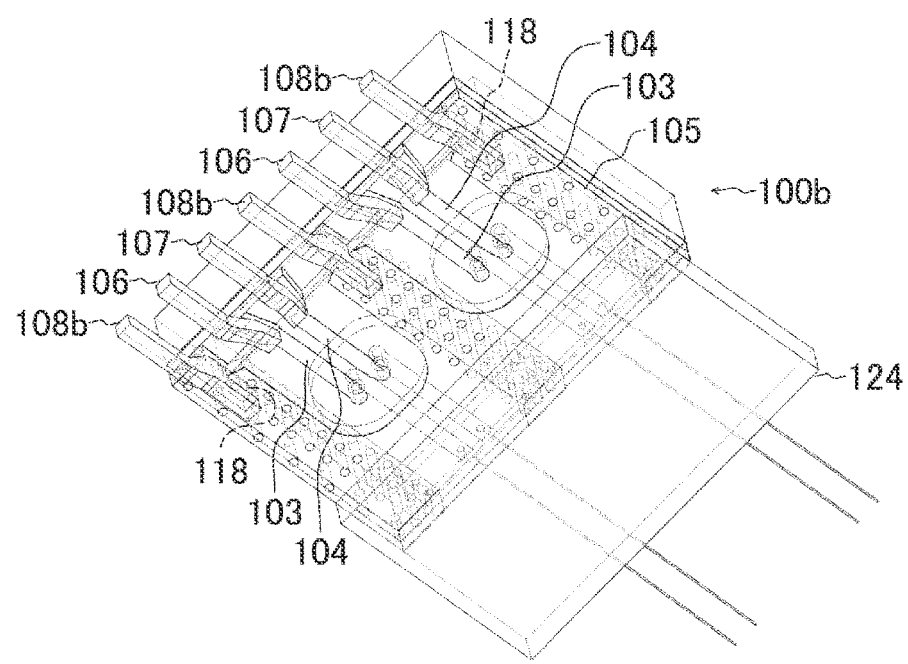
FIG. 4 is a perspective view showing the configuration of a high frequency package according to the fourth embodiment of the present invention.

A high frequency package 100*b* according to the fourth embodiment of the present invention will be described next with reference to FIG. 4. FIG. 4 shows a state viewed from the side of the mounting surface of a package main body 101. The high frequency package includes the package main body 101, and differential coplanar lines 102. The package main body 101 includes a substrate 101*a*, and the differential coplanar lines 102 are formed on the substrate 101*a*. The differential coplanar line 102 includes a first signal line 103, a second signal line 104, and a plurality of ground lines 105. The high frequency package 100*b* also includes first signal lead pins 106 and second signal lead pins 107. These components are the same as in the above-described second embodiment.

In the fourth embodiment, at one end of the ground lead pin 108*b*, an embedded portion 118 partially embedded in the substrate 101*a* in the thickness direction is provided. In addition, the portion of one end of the ground lead pin 108*b* including the embedded portion 118 can be formed thicker than in other regions. When the portion including the embedded portion 118 is formed thicker than in other regions, crosstalk between adjacent channels can further be reduced.

Fifth Embodiment

Figure 5:
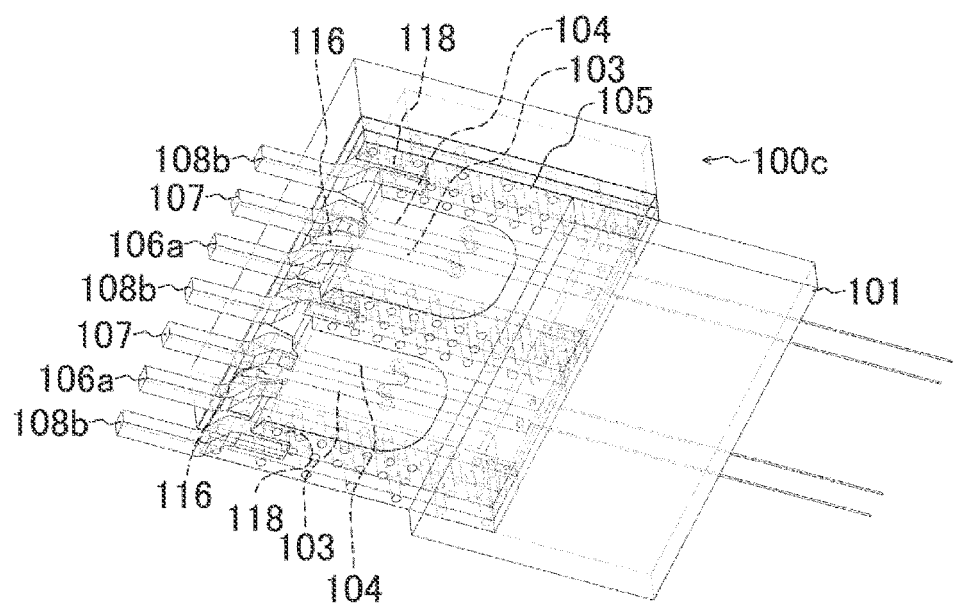
FIG. 5 is a perspective view showing the configuration of a high frequency package according to the fifth embodiment of the present invention.

A high frequency package 100*c* according to the fifth embodiment of the present invention will be described next with reference to FIG. 5. FIG. 5 shows a state viewed from the side of the mounting surface of a package main body 101. The high frequency package 100*c* includes the package main body 101, and differential coplanar lines 102. The package main body 101 includes a substrate 101*a*, and the differential coplanar lines 102 are formed on the substrate 101*a*. The differential coplanar line 102 includes a first signal line 103, a second signal line 104, and a plurality of ground lines 105. These components are the same as in the above-described second embodiment. In the fifth embodiment as well, second signal lead pins 107 are provided, as in the above-described second embodiment.

In the fifth embodiment, at one end of a ground lead pin 108b, an embedded portion 118 partially embedded in the substrate 101a in the thickness direction is provided, as in the above-described fourth embodiment. Additionally, in the fifth embodiment, at one end of a first signal lead pin 106a, an embedded portion 116 partially embedded in the substrate 101a in the thickness direction is provided. In the fifth embodiment, each line of the differential coplanar line 102, which is connected to a lead pin, is embedded in the package main body 101 (substrate 101a), and the embedded portion of each lead pin is connected to the embedded line. When a part of one end of the lead pin is embedded in this way, the differential coplanar line 102 can be embedded in the substrate 101a on the side of the mounting surface of the package main body 101. As a result, on the side of the mounting surface of the package main body 101, leakage of an electromagnetic field to the space can be suppressed, and the problem of EMI (ElectroMagnetic Interference) or EMC (Electro-Magnetic Compatibility) can be reduced.

Sixth Embodiment

Figure 6:
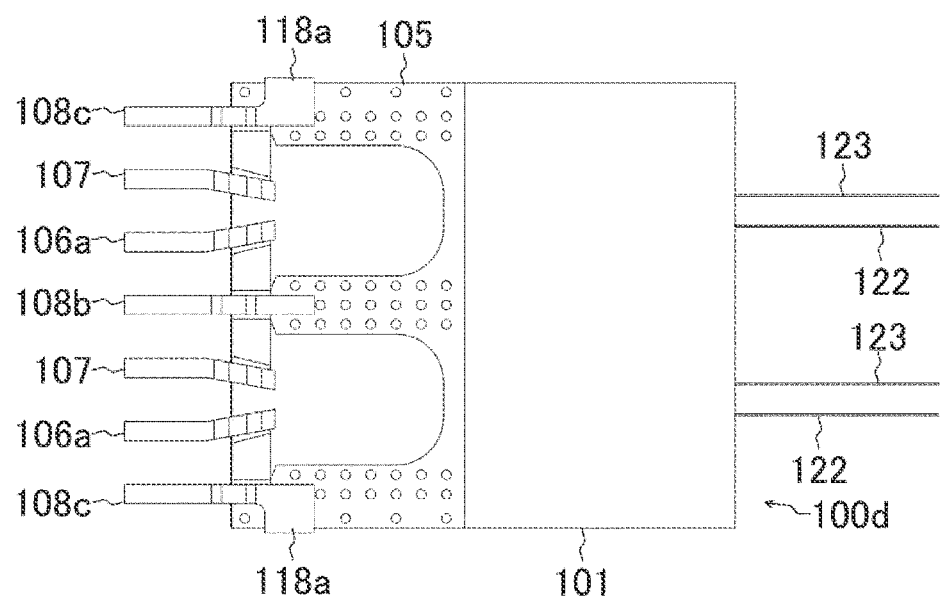
FIG. 6 is a plan view showing the configuration of a high frequency package according to the sixth embodiment of the present invention.

A high frequency package 100d according to the sixth embodiment of the present invention will be described next with reference to FIG. 6. FIG. 6 shows a state viewed from the side of the mounting surface of a package main body 101. The high frequency package 100d includes the package main body 101, and differential coplanar lines 102. The package main body 101 includes a substrate 101a, and the differential coplanar lines 102 are formed on the substrate 101a. The differential coplanar line 102 includes a first signal line 103, a second signal line 104, and a plurality of ground lines 105. These components are the same as in the above-described fifth embodiment. In the sixth embodiment as well, first signal lead pins 106a and second signal lead pins 107 are provided, as in the above-described fifth embodiment.

In the sixth embodiment, at one end of a ground lead pin 108c, an embedded portion 118a partially embedded in the substrate 101a in the thickness direction is provided. In addition, the portion of one end of the ground lead pin 108c including the embedded portion 118a is formed wider than in other regions. This configuration can make the ground potential more stable on the side of the mounting surface of the package main body 101 and can make the stability of the ground potential of the package main body 101 more reliable.

Seventh Embodiment

Figure 7:
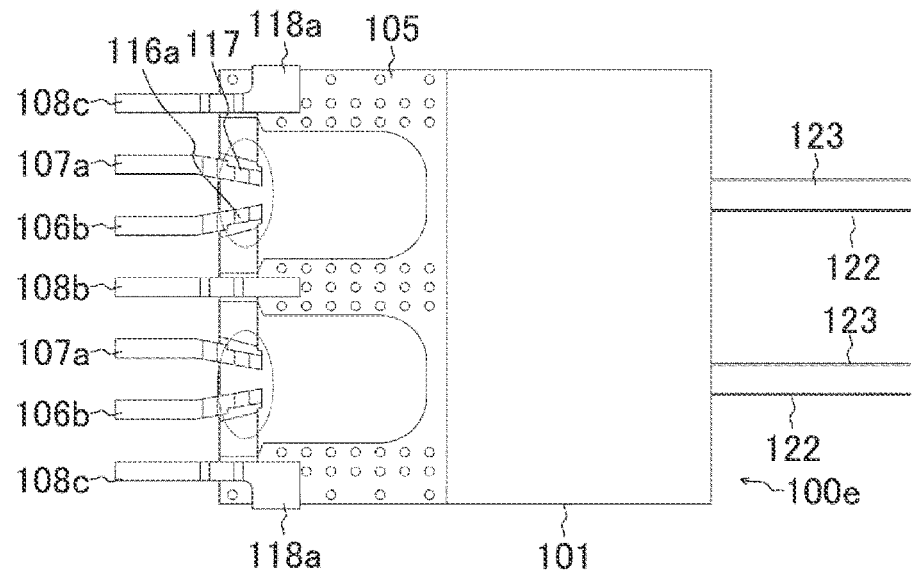
FIG. 7 is a plan view showing the configuration of a high frequency package according to the seventh embodiment of the present invention.

A high frequency package 100e according to the seventh embodiment of the present invention will be described next with reference to FIG. 7. FIG. 7 shows a state viewed from the side of the mounting surface of a package main body 101. The high frequency package 100e includes the package main body 101, and differential coplanar lines 102. The package main body 101 includes a substrate 101a, and the differential coplanar lines 102 are formed on the substrate 101a. The differential coplanar line 102 includes a first signal line 103, a second signal line 104, and a plurality of ground lines 105. Ground lead pins 108c are also provided. These components are the same as in the above-described sixth embodiment.

In the seventh embodiment, one end of a first signal lead pin 106b includes a narrow portion 116a formed narrower than in other regions, and one end of a second signal lead pin 107a includes a narrow portion 117 formed narrower than in other regions. With this configuration, the distance to the ground lead pin 108c adjacent to the first signal lead pin 106b and the second signal lead pin 107a is wider than in other regions. This configuration can make, for example, the distance between one end of the signal lead pin and one end of the ground lead pin wider as compared to the configuration according to the first embodiment.

Figure 8:
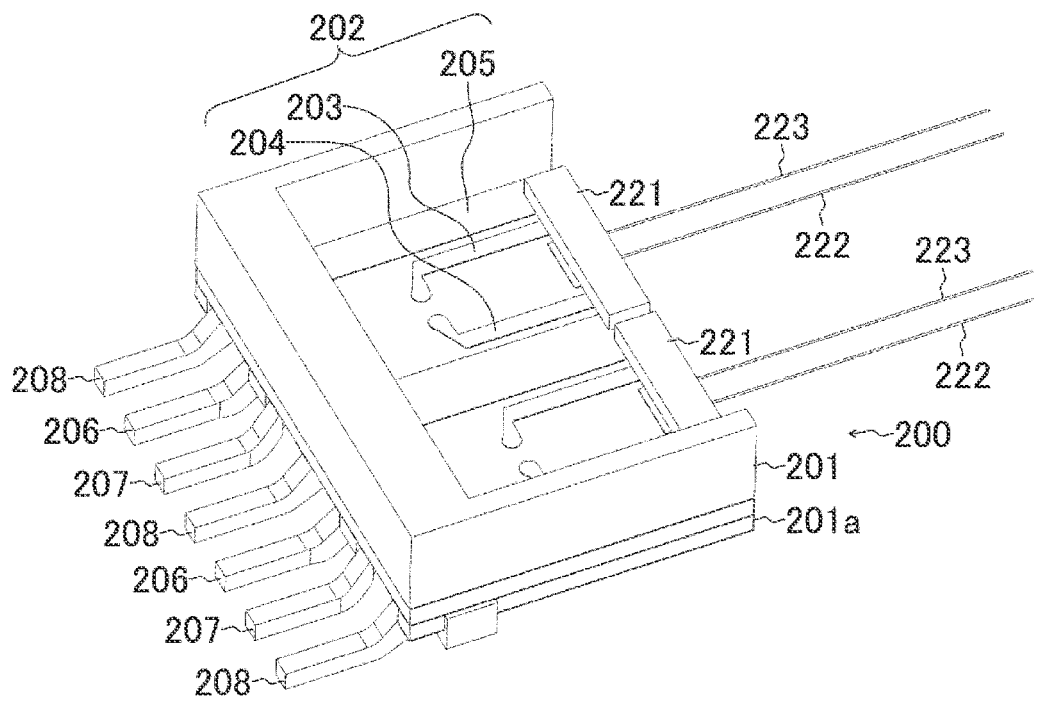
FIG. 8 is a perspective view showing the configuration of a high frequency package.
Figure 9:
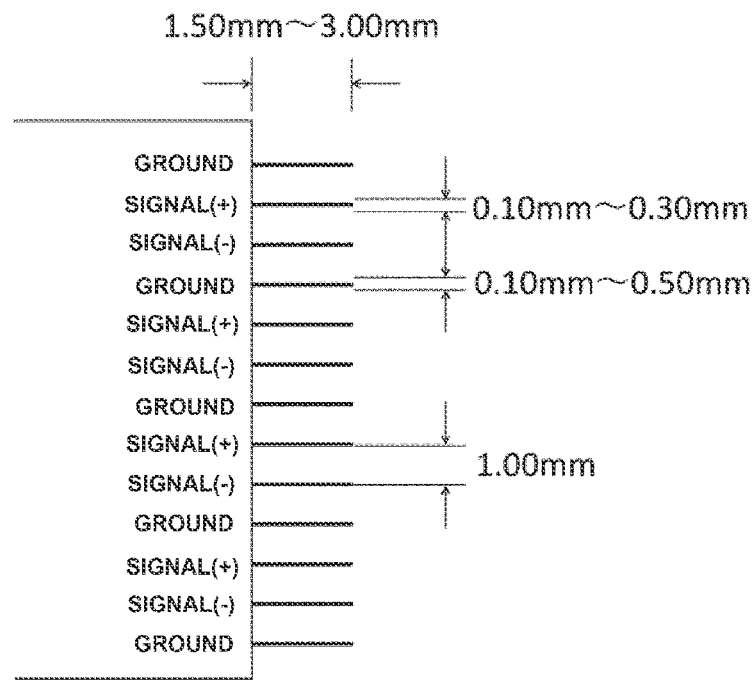
FIG. 9 is an explanatory view showing the configuration of a conventional high frequency package.
Figure 10:
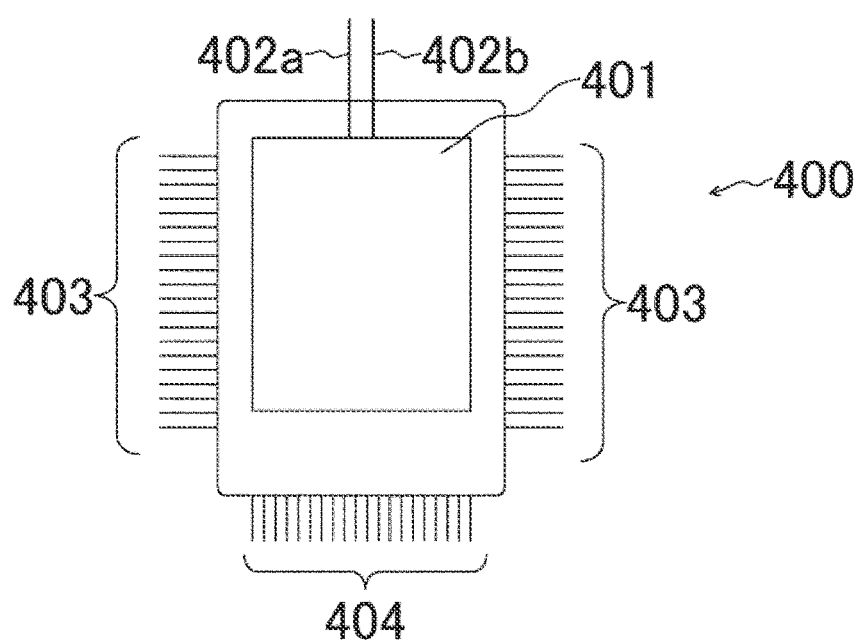
FIG. 10 is a view showing the configuration of a conventional optical reception module.
Figure 11:
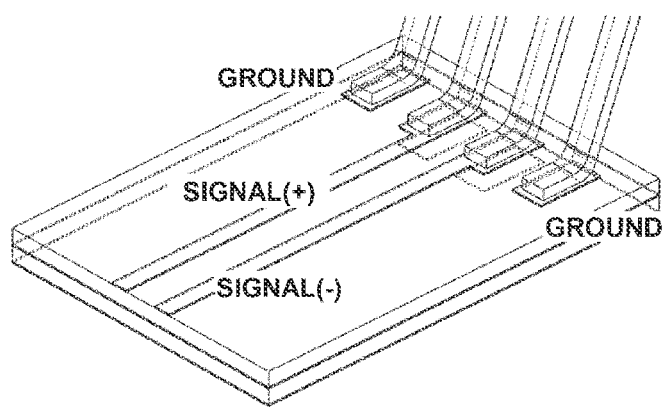
FIG. 11 is a perspective view showing the configuration of a part of the conventional high frequency package.

As shown in FIG. 8, a differential coplanar line 202 provided on the surface side on the opposite side of the mounting surface of a package main body 201 of a high frequency package 200 can also have a side couple line structure formed by a first signal line 203, a second signal line 204, and a ground line 205. With this configuration, conversion between an optical signal and a high frequency electrical signal can be performed between an optical fiber 222 and an optical fiber 223 by a single end X2 type photoelectric conversion chip 221 formed by one photodiode or the like.

Note that in the high frequency package 200, as described above, the package main body 201 includes a substrate 201a made of an insulator, and also includes first signal lead pins 206, second signal lead pins 207, and ground lead pins 208.

As described above, according to embodiments of the present invention, it is possible to appropriately set electromagnetic coupling serving as a differential transmission path between two signal lines because each lead pin is bent such that each lead pin, whose one end is arranged on the mounting surface of the package main body, has the other end apart from the mounting surface.

Note that the present invention is not limited to the above-described embodiments, and it is obvious that many modifications and combinations can be made by a person skilled in the art in this field within the technical scope of the present invention.

EXPLANATION OF THE REFERENCE NUMERALS AND SIGNS

100 . . . high frequency package, 101 . . . package main body, 101a . . . substrate, 102 . . . differential coplanar line, 103 . . . first signal line, 104 . . . second signal line, 105 . . . ground line, 106 . . . first signal lead pin, 107 . . . second signal lead pin, 108 . . . ground lead pin, 121 . . . photoelectric conversion chip, 122 . . . optical fiber, 123 . . . optical fiber.

The invention claimed is:

1. A high frequency package comprising:
a package main body including a substrate made of an insulator;
a differential coplanar line on the substrate;
a first signal lead pin arranged on a side of a mounting surface of the package main body, the first signal lead pin being bent such that a first end is connected to a first signal line of the differential coplanar line and a second end is apart from the mounting surface;
a second signal lead pin arranged on the side of the mounting surface of the package main body, the second signal lead pin being bent such that a first end is connected to a second signal line of the differential coplanar line and a second end is apart from the mounting surface, and the second signal lead pin extending in a same direction as the first signal lead pin; and a ground lead pin arranged on the side of the mounting surface of the package main body, the ground lead pin being bent such that a first end is connected to a ground line of the differential coplanar line and a second end is apart from the mounting surface, and the ground lead pin extending in a same direction as the first signal lead pin, wherein a distance between the second end of the first signal lead pin and the second end of the second signal lead pin is different from a distance between the first end of the first signal lead pin and the first end of the second signal lead pin, wherein:

the package main body comprises a metal layer to which the ground line is connected; and the metal layer includes notches around a first connecting portion between the first end of the first signal lead pin and the first signal line and a second connecting portion between the first end of the second signal lead pin and the second signal line.

2. The high frequency package according to claim 1, wherein:

a distal end of the ground lead pin on the second end, a distal end of the first signal lead pin on the second end, and a distal end of the second signal lead pin on the second end are arranged on a same line; and the ground lead pin is longer than the first signal lead pin and the second signal lead pin.

3. The high frequency package according to claim 1, wherein:

at the first end of the ground lead pin, an embedded portion partially embedded in the substrate in a thickness direction is disposed.

4. The high frequency package according to claim 3, wherein:

a portion of the first end of the ground lead pin including the embedded portion is thicker than in other regions.

5. The high frequency package according to claim 3, wherein:

a portion of the first end of the ground lead pin including the embedded portion is wider than in other regions.

6. The high frequency package according to claim 3, wherein:

at the first end of the first signal lead pin, an embedded portion partially embedded in the substrate in the thickness direction is disposed.

7. The high frequency package according to claim 1, wherein:

each of the first end of the first signal lead pin and the first end of the second signal lead pin comprises a narrow portion that is narrower than in other regions and disposed such that a distance to the ground lead pin adjacent to the first signal lead pin and the second signal lead pin is wider than in other regions.

8. The high frequency package according to claim 3, wherein a part of a surface of the embedded portion is exposed from the substrate.

9. A method comprising:

providing a package main body including a substrate made of an insulator;

forming a differential coplanar line on the substrate;

arranging a first signal lead pin on a side of a mounting surface of the package main body, the first signal lead pin being bent such that a first end is connected to a first signal line of the differential coplanar line and a second end is apart from the mounting surface;

arranging a second signal lead pin on the side of the mounting surface of the package main body, the second signal lead pin being bent such that a first end is connected to a second signal line of the differential coplanar line and a second end is apart from the mounting surface, and the second signal lead pin extending in a same direction as the first signal lead pin; and arranging a ground lead pin on the side of the mounting surface of the package main body, the ground lead pin being bent such that a first end is connected to a ground line of the differential coplanar line and a second end is apart from the mounting surface, and the ground lead pin extending in a same direction as the first signal lead pin, wherein a distance between the second end of the first signal lead pin and the second end of the second signal lead pin is different from a distance between the first end of the first signal lead pin and the first end of the second signal lead pin, wherein:

the package main body comprises a metal layer to which the ground line is connected; and the metal layer includes notches around a first connecting portion between the first end of the first signal lead pin and the first signal line and a second connecting portion between the first end of the second signal lead pin and the second signal line.

10. The method according to claim 9, wherein:

a distal end of the ground lead pin on the second end, a distal end of the first signal lead pin on the second end, and a distal end of the second signal lead pin on the second end are arranged on a same line; and the ground lead pin is longer than the first signal lead pin and the second signal lead pin.

11. The method according to claim 9, wherein:

at the first end of the ground lead pin, an embedded portion partially embedded in the substrate in a thickness direction is disposed.

12. The method according to claim 11, wherein:

a portion of the first end of the ground lead pin including the embedded portion is thicker than in other regions.

13. The method according to claim 11, wherein:

a portion of the first end of the ground lead pin including the embedded portion is wider than in other regions.

14. The method according to claim 11, wherein:

at the first end of the first signal lead pin, an embedded portion partially embedded in the substrate in the thickness direction is disposed.

15. The method according to claim 9, wherein:

each of the first end of the first signal lead pin and the first end of the second signal lead pin comprises a narrow portion that is narrower than in other regions and disposed such that a distance to the ground lead pin adjacent to the first signal lead pin and the second signal lead pin is wider than in other regions.

16. The method according to claim 11, wherein a part of a surface of the embedded portion is exposed from the substrate.

* * * * *